(12) United States Patent
Krivonak et al.

(10) Patent No.: US 9,179,544 B1
(45) Date of Patent: Nov. 3, 2015

(54) METHOD AND APPARATUS FOR MECHANICAL LOAD REDUCTION ON THE ELECTRICAL TERMINALS OF A CAPACITOR

(71) Applicant: GENERAL ELECTRIC COMPANY, Schenectady, NY (US)

(72) Inventors: Andrew Louis Krivonak, Lawrence Park, PA (US); Patrick Lee Jansen, Schenectady, NY (US); Mark Allen Murphy, Erie, PA (US); Frank Dolski, Lawrence Park, PA (US)

(73) Assignee: General Electric Company, Schenectady, NY (US)

( * ) Notice: Subject to any disclaimer, the term of this patent is extended or adjusted under 35 U.S.C. 154(b) by 11 days.

(21) Appl. No.: 14/263,681

(22) Filed: Apr. 28, 2014

(51) Int. Cl.
| | |
|---|---|
| *H01R 13/46* | (2006.01) |
| *H05K 5/00* | (2006.01) |
| *H05K 1/02* | (2006.01) |
| *H01G 2/06* | (2006.01) |
| *H05K 1/18* | (2006.01) |
| *H05K 3/30* | (2006.01) |

(52) U.S. Cl.
CPC ............... *H05K 1/028* (2013.01); *H01G 2/065* (2013.01); *H05K 1/181* (2013.01); *H05K 3/30* (2013.01); *H05K 5/0026* (2013.01); *H05K 2201/0397* (2013.01); *H05K 2201/10015* (2013.01); *H05K 2201/10272* (2013.01)

(58) Field of Classification Search
USPC ............................................ 174/520, 521, 50
See application file for complete search history.

(56) References Cited

U.S. PATENT DOCUMENTS

| | | | |
|---|---|---|---|
| 2,762,597 | A | 9/1956 | Jaworski |
| 3,470,421 | A | 9/1969 | Shore et al. |
| 7,683,494 | B1 * | 3/2010 | Stortini et al. ................ 257/785 |
| 2012/0279148 | A1 * | 11/2012 | Gagne et al. ................ 52/173.1 |

* cited by examiner

*Primary Examiner* — Andargie M Aychillhum
(74) *Attorney, Agent, or Firm* — GE Global Patent Operation; John A. Kramer

(57) ABSTRACT

In an embodiment, an apparatus for reducing the mechanical load on the electrical terminals of a capacitor includes a plate having a planar body and one or more deflectable tabs connected to the planar body, one or more capacitors respectively mounted to the plate via the one or more deflectable tabs, and a busbar electrically connected to the one or more capacitors such that the one or more capacitors are arranged intermediate the plate and the busbar. The deflectable tabs are configured to support the capacitors, and to move towards and away from the planar body for accommodating size variances in the capacitors relative to a fixed spacing between the busbar and an enclosure.

15 Claims, 13 Drawing Sheets

METHOD AND APPARATUS FOR MECHANICAL LOAD REDUCTION ON THE ELECTRICAL TERMINALS OF A CAPACITOR

FIELD OF THE INVENTION

Embodiments of the invention relate generally to capacitors. Other embodiments relate to a method and apparatus for reducing mechanical load on a capacitor.

BACKGROUND OF THE INVENTION

A capacitor is a passive two-terminal electrical component used to store energy electrostatically in an electric field. The forms of practical capacitors vary widely, but all contain at least two electrical conductors (plates) separated by a dielectric (i.e., insulator). The conductors can be thin films of metal, aluminum foil or disks, etc. The 'nonconducting' dielectric acts to increase the capacitor's charge capacity. A dielectric can be glass, ceramic, plastic film, air, paper, mica, etc. Capacitors are widely used as parts of electrical circuits in many common electrical devices and function to store energy in the form of an electrostatic field between its plates.

A capacitor has two sets of connection features: electrical and mechanical. The mechanical set is intended to be a rigid connection to some structure to support the mechanical load due to the mass of the capacitor. The electrical set is intended to be a strictly electrical connection that supports no mechanical load other than that due to the clamping of electrical terminals of the capacitor to an electrically conductive structure. This type of coupled connection is practical when the conductor attached to the capacitor's electrical terminals is mechanically compliant or readily deformable, such as wires or cables or a thin layer of copper.

Complex systems can require numerous capacitors and other components to which the capacitors are connected in the circuit of the system and to which cables must be run to and from the capacitors. In systems with high electrical currents, the size of cables can be large which makes assembly of the wires difficult, time consuming, and inefficient in its use of available packaging space. The same concerns apply to layers of copper, which can also require separate electrical insulation layers to be installed in the assembly.

A laminated busbar can be used to make efficient use of the available space and improve upon the assembly time required for cables or individual layers of copper and insulation. It also offers an improvement in inductance when compared with equivalent cabling. However, a laminated busbar with multiple layers is stiff in comparison to the previous conductors. This stiffness introduces a rigid connection in two different planes for the capacitors. Any variation from the nominal dimensions of the capacitor geometry may introduce added assembly stresses to both the electrical and mechanical connections. An electrical joint that is both free of mechanical stress and is a rigid non-compliant connection between the capacitor and busbar is therefore desirable to maximize reliability and durability of the system over time.

For example, with reference to FIG. 1, a typical capacitor assembly 10 consists of a plurality of capacitors 12, 14, 16, each having a mounting foot 18 and a pair of electrical terminals 20 operatively attached to a laminated busbar 22 in a mounting plane 24 necessary for electrical contact. As will be readily appreciated, capacitors are designed to a nominal height, however, normal manufacturing variations and accepted manufacturing tolerances result in the production of capacitors that are both taller and shorter than this nominal value. For example, as shown in FIG. 1, first capacitor 12 may have the desired, nominal height. A second capacitor 14, however, may have a larger height and a third capacitor 16 may have a smaller height, but still within manufacturing tolerances. As noted above, it is desirable that the electrical terminals 20 of each of the capacitors 12, 14, 16 connect to the laminated busbar 22 with minimal mechanical stress, while the mass of the capacitors 12, 14, 16 is supported by attaching the mounting feet 18 to some support structure via fastening means known in the art. As will be readily appreciated, the variation in height either requires each capacitor to connect to the busbar 22 in a separate plane, or to the support structure in a separate plane, while maintaining electrical contact with the laminated busbar 22 with minimal mechanical stress and with the mass of the capacitors being supported at each mounting foot 16.

As illustrated in FIGS. 2 and 3, if the distance between the laminated busbar 22 and support structure 26 is rigid and is designed to match the nominal height of the busbar 22, mechanical stress is introduced as the busbar 22 and/or support 26 deflects to accommodate the height variation. For example, as shown in FIG. 2, mechanical stress may be introduced into the support structure 26 at 28 due to the height variation of the tallest capacitor 14, and at 30 due to the height variation of the shortest capacitor 16. As shown in FIG. 3, mechanical stress may also, or alternately, be introduced into the busbar 22 at 32 due to the height variation of the tallest capacitor 14, and at 34 due to the height variation of the shortest capacitor 16. Undesirably, this mechanical stress introduced in the support structure 26 and/or busbar 22 can translate to undesirable stress on the electrical terminals 18 of the capacitors.

BRIEF DESCRIPTION OF THE INVENTION

The present invention relates to an apparatus for reducing the mechanical load on the electrical terminals of a capacitor. In an embodiment, the apparatus comprises a support having one or more deflectable tabs, one or more capacitors respectively mounted to the support via the one or more deflectable tabs, and a busbar electrically connected to the one or more capacitors such that the one or more capacitors are arranged intermediate the support and the busbar. The support may comprise, for example, a plate having a planar body and the one or more deflectable tabs connected to the planar body.

In another embodiment, an apparatus comprises an enclosure, a plate, a laminated busbar, and plural capacitors. The enclosure comprises a substrate and a plurality of upstanding walls attached to the substrate. The plate is located within the enclosure, and comprises a planar body and plural deflectable tabs connected to the planar body. The laminated busbar is mounted to the substrate within the enclosure. The plural capacitors are housed within the enclosure, and comprise respective mounting feet and respective pairs of electrical terminals. (That is, each capacitor has a respective mounting foot and a respective pair of electrical terminals.) The mounting feet are respectively mechanically mounted to the deflectable tabs of the plate and the electrical terminals are electrically connected to the laminated busbar, such that the capacitors are sandwiched between the plate and the busbar. The plate is attached to at least one of the upstanding walls, which provides support for the plate for the deflectable tabs to deflect towards and away from the planar body, in dependence upon respective heights of the capacitors, to alleviate stresses in the capacitors and/or the busbar. Thus, considering the capacitors are positioned between the busbar and one of the walls, with there being a set distance between the busbar and the wall, the plate accommodates height variances in the capacitors arising from manufacturing tolerances, thereby alleviating mechanical stresses that otherwise would have been present.

In another embodiment, a method for reducing the mechanical load on the electrical terminals of a capacitor comprises mounting a capacitor to a support having a plurality of deflectable tabs (e.g., a plate having a planar body and the plurality of deflectable tabs attached to the planar body), by fastening a mounting foot of the capacitor to at least one of the deflectable tabs. The method further comprises creating an electrical connection between the capacitor and a busbar by fastening electrical terminals of the capacitor to the busbar.

BRIEF DESCRIPTION OF THE DRAWINGS

The present invention will be better understood from reading the following description of non-limiting embodiments, with reference to the attached drawings, wherein below.

DETAILED DESCRIPTION OF THE INVENTION

Figure 1:
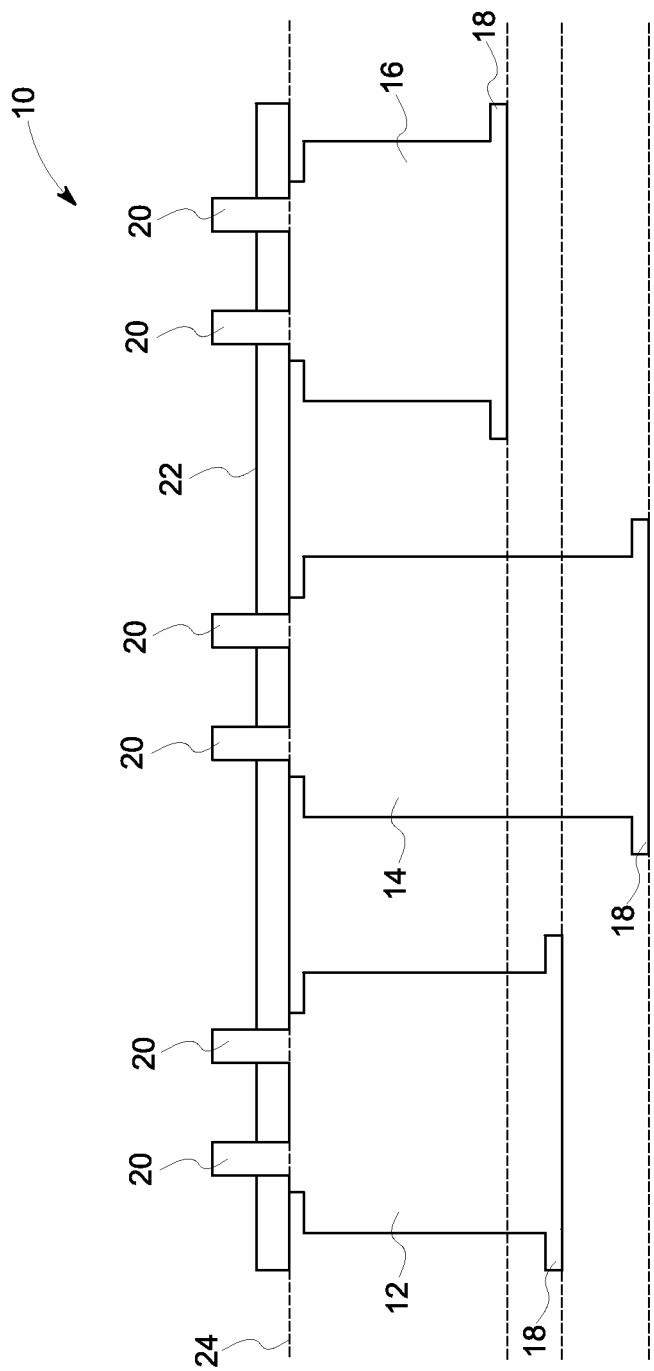
FIG. 1 is a cross-sectional view of a prior art capacitor assembly, illustrating variation in capacitor height due to manufacturing variances.
Figure 2:
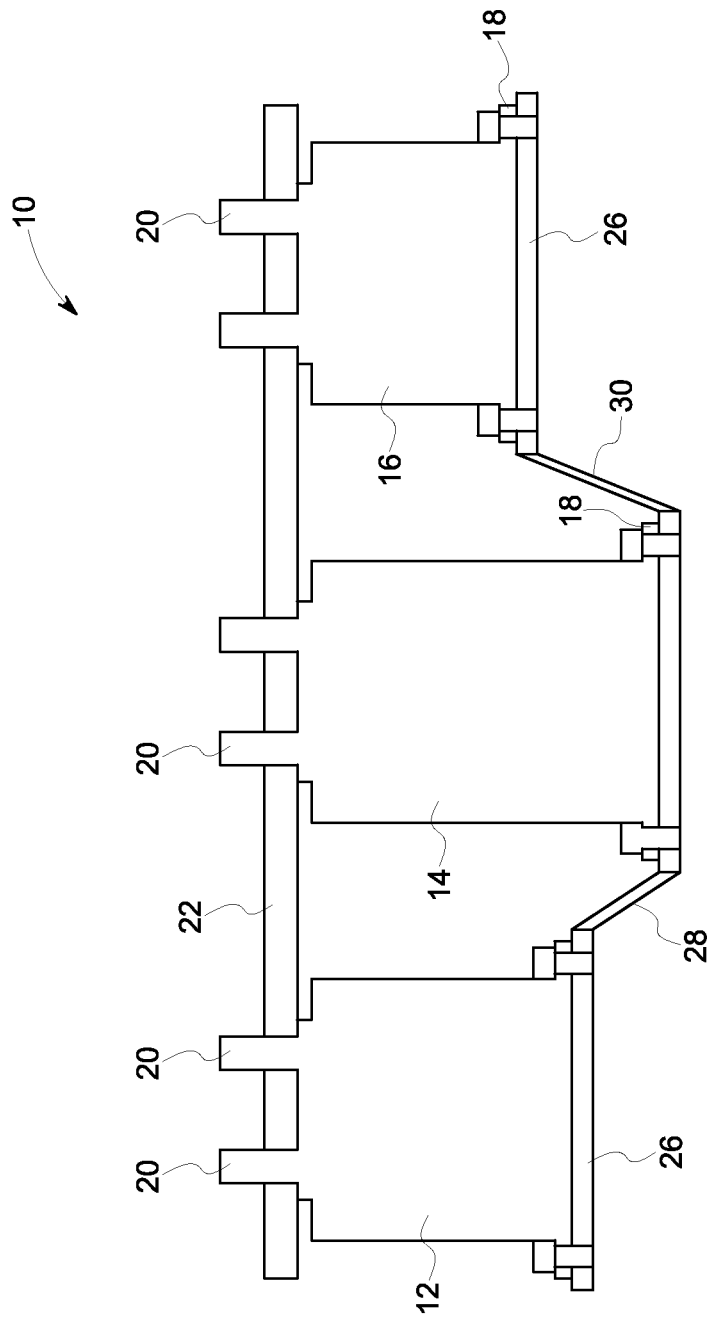
FIG. 2 is a cross-section view of a prior art capacitor assembly, illustrating the introduction of mechanical stress in a support substrate due to capacitor height variation.
Figure 3:
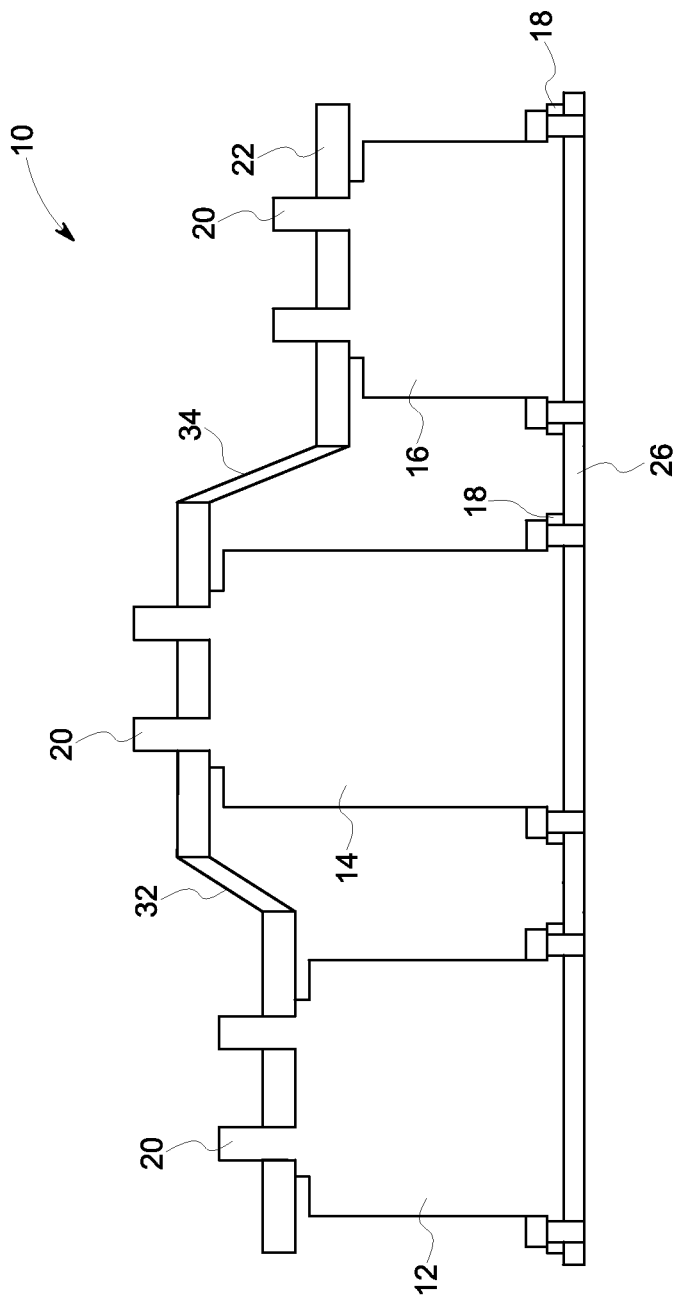
FIG. 3 is a cross-sectional view of a prior art capacitor assembly, illustrating the introduction of mechanical stress in the laminated busbar and electrical terminals of the capacitors.

Reference will be made below in detail to exemplary embodiments of the invention, examples of which are illustrated in the accompanying drawings. Wherever possible, the same reference numerals used throughout the drawings refer to the same or like parts.

Turning now to FIGS. 4-7, embodiments of the invention relate to an apparatus 100 that reduces the mechanical load/stress on the electrical terminals of a capacitor. As used herein, "capacitor" means any passive device used to store an electric charge, consisting of one or more pairs of conductors separated by an insulator, including, but not limited to ultra-capacitors, supercapacitors, and hybrid/asymmetric capacitors. As shown therein, the apparatus 100 includes a busbar 110 (which may be, for example, a laminated busbar), one or more capacitors 112 (in the embodiment shown in FIGS. 4-7, plural capacitors are shown) each having a mounting foot and a pair of electrical terminals 113, and a support (e.g., a plate 114). The electrical terminals 113 of the capacitors 112 are attached to the laminated busbar or other busbar 110 and form an electrical connection therewith, as is known in the art. While the busbar 110 is shown as being substantially L-shaped in cross section (e.g., the busbar comprises a first planar portion and a second planar portion attached to the first planar portion at a right angle), it may take any form or shape known in the art, such as substantially planar and the like, without departing from the broader aspects of the present invention. Moreover, while embodiments of the apparatus 100 are illustrated herein as having six capacitors 112, it is contemplated that the apparatus 100 may have any number of capacitors (i.e., one or more capacitors) depending upon the particular application.

The support comprises one or more deflectable tabs 116 (also referred to herein as spring tabs), to which the capacitors 112 are attached, such that the capacitors lie intermediate the busbar 110 and the support. In embodiments, the support comprises a plate 114, as described below. In other embodiments, the support is not principally planar or otherwise plate-like. For example, the support could comprise receptacles with interior deflectable tabs for receiving the capacitors, or it could comprise an annular member having a deflectable tab attached thereto and extending out of a major plane defined by the annular member. Regardless of its particular configuration, however, the support may be configured to hold the one or more deflectable tabs in lateral alignment with the capacitors 112.

Figure 7:
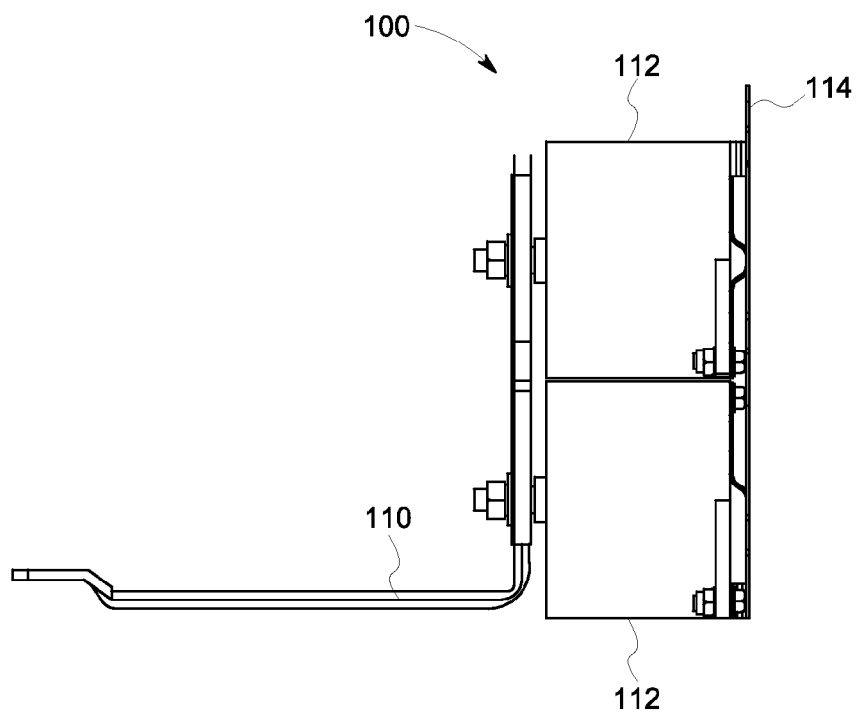
FIG. 7 is a right-side, elevational view of the apparatus of FIG. 4.
Figure 8:
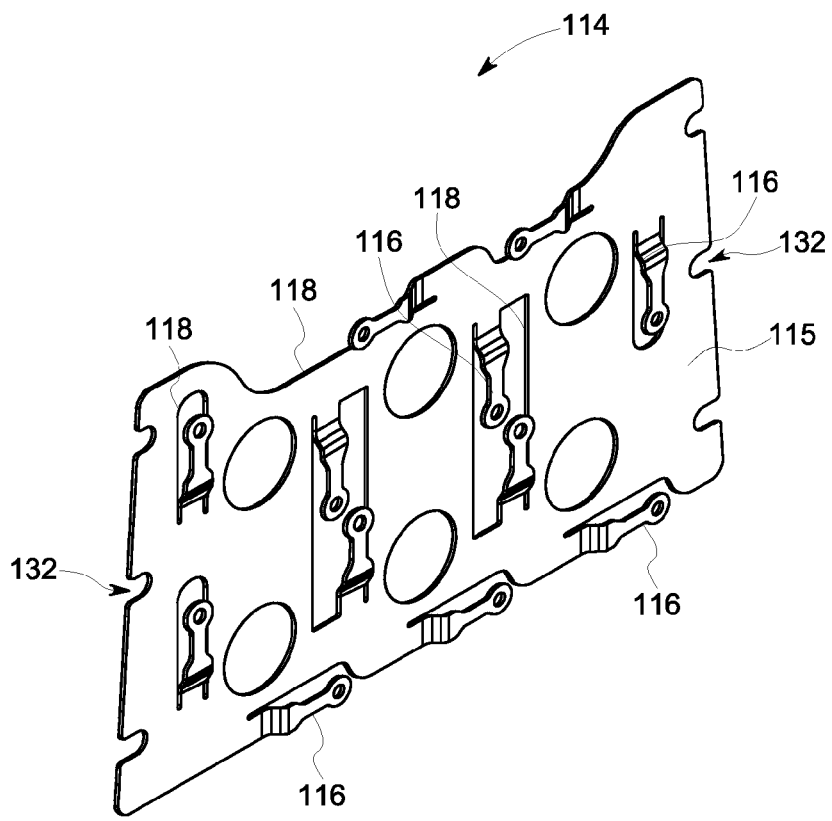
FIG. 8 is a perspective view of a spring plate of the apparatus of FIG. 4.
Figure 9:
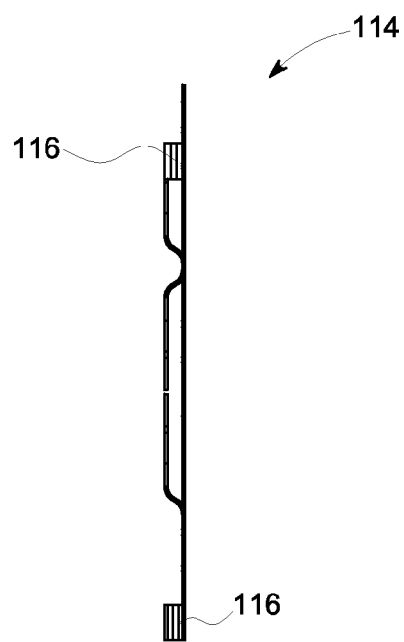
FIG. 9 is a right-side elevational view of the spring plate of FIG. 8.
Figure 10:
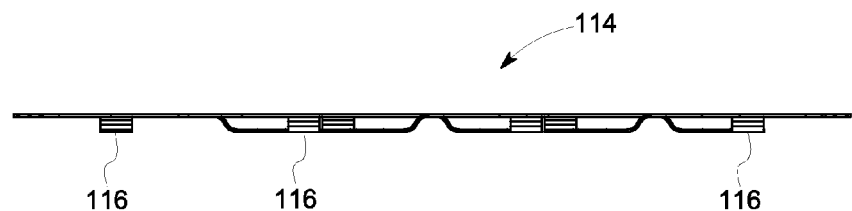
FIG. 10 is a top plan view of the spring plate of FIG. 8.
Figure 11:
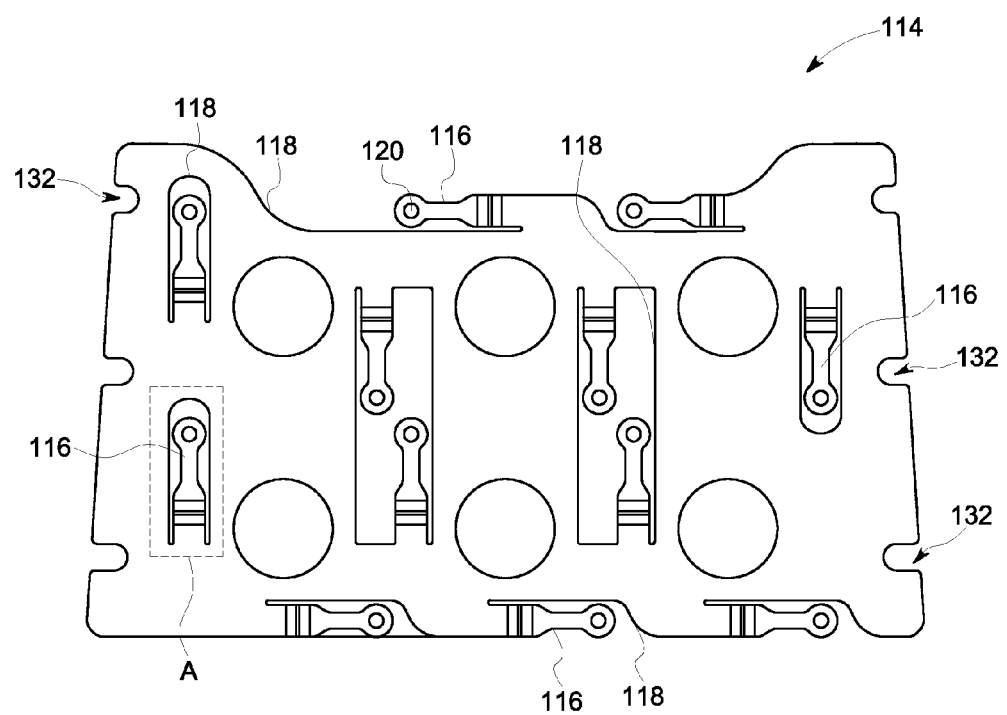
FIG. 11 is a front elevational view of the spring plate of FIG. 8.
Figure 12:
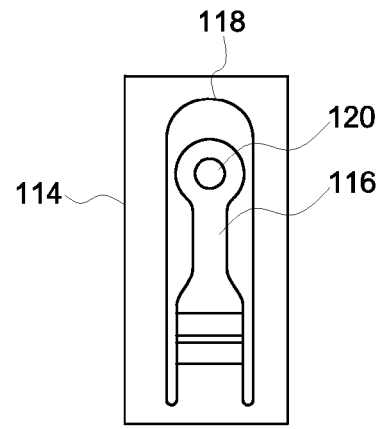
FIG. 12 is an enlarged, detail view of area A of FIG. 11, illustrating a spring tab of the spring plate.
Figure 13:
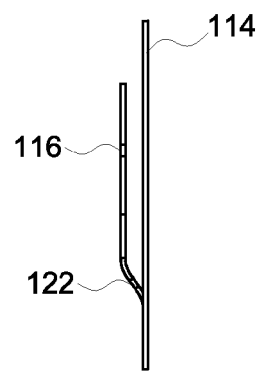
FIG. 13 is a right-side, elevational view of the spring tab of FIG. 12.
Figure 14:
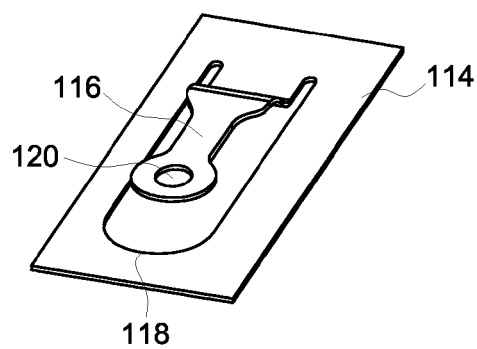
FIG. 14 is an enlarged, perspective view of a spring tab of the spring plate.

In embodiments, as noted, the support comprises a plate 114, which is also referred to herein as a spring plate. As shown in FIGS. 8-11, the spring plate 114 may be generally rectangular in shape, and comprises a planar body 115 and the one or more deflectable tabs 116 (also referred to herein as spring tabs) attached to the planar body 115. (In FIGS. 8-11, the plate 114 comprises plural deflectable tabs 116.) The deflectable tabs 116 protrude into relieved portions 118 of the spring plate 114. In an embodiment, the spring plate 114, including the deflectable tabs 116, is formed from thin gauge steel. For example, the spring plate 114 may be formed from a unitary sheet of steel or other metal, which is first machined or stamped to produce the planar or plan view configuration of the plate, and which is then stamped or otherwise formed for the tabs 116 to lie offset from the plane defined by the planar body 115 of the plate 114. Alternatively, the plate 114 can be molded from plastic. The tabs 116 each include a mounting aperture 120 and have a specific geometry and stiffness sufficient to produce a desirable amount of spring force under an expected deflection, as discussed in detail below. In particular, as best shown in FIGS. 12-14, each deflectable tab 116 extends longitudinally from its mating point with the spring plate body 115 into the relieved portion 118, and includes an angled portion 122 that functions to position the distal end of each tab 116 above the top surface of the spring plate body 115. These tabs 116 are located on the spring plate 114 such that they match up with the footprint of the mounting feet of the capacitors. In this regard, the tabs 116 of the spring plate 114 are bolted to the mechanical mounting feet of the capacitors 112 as shown in FIGS. 4, 5, and 7.

Figure 4:
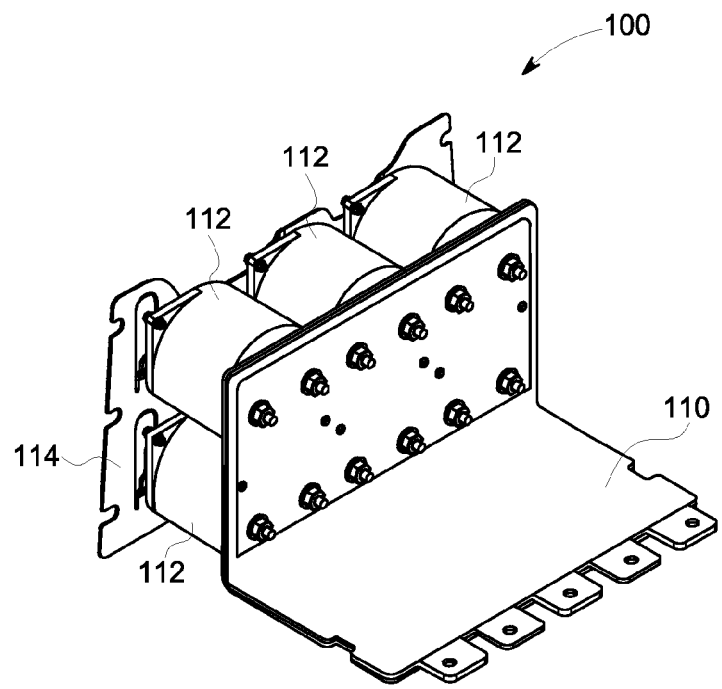
FIG. 4 is a perspective view of an apparatus for reducing the mechanical load on the electrical terminals of a capacitor, in accordance with an embodiment of the invention.
Figure 5:
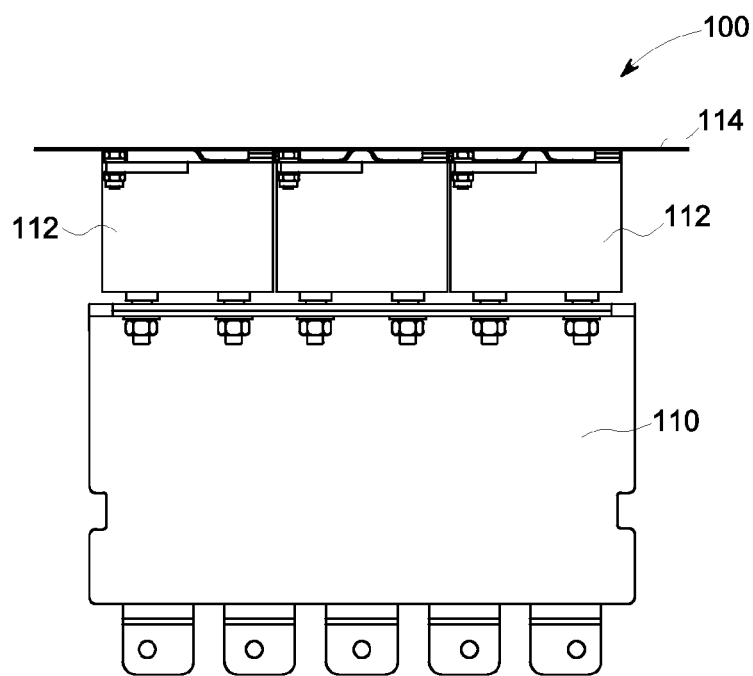
FIG. 5 is a top plan view of the apparatus of FIG. 4.
Figure 6:
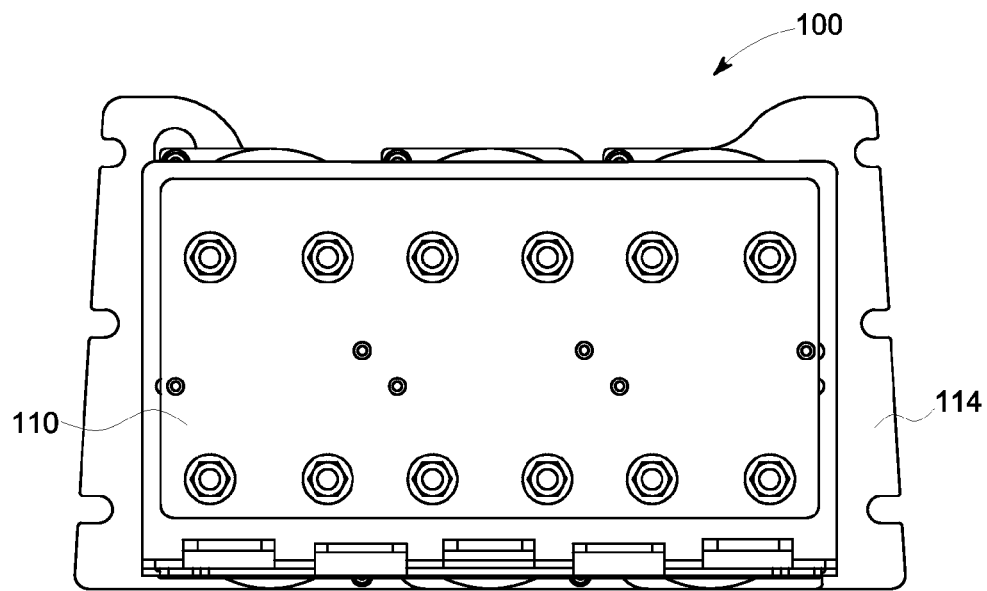
FIG. 6 is a front, elevational view of the apparatus of FIG. 4.
Figure 15:
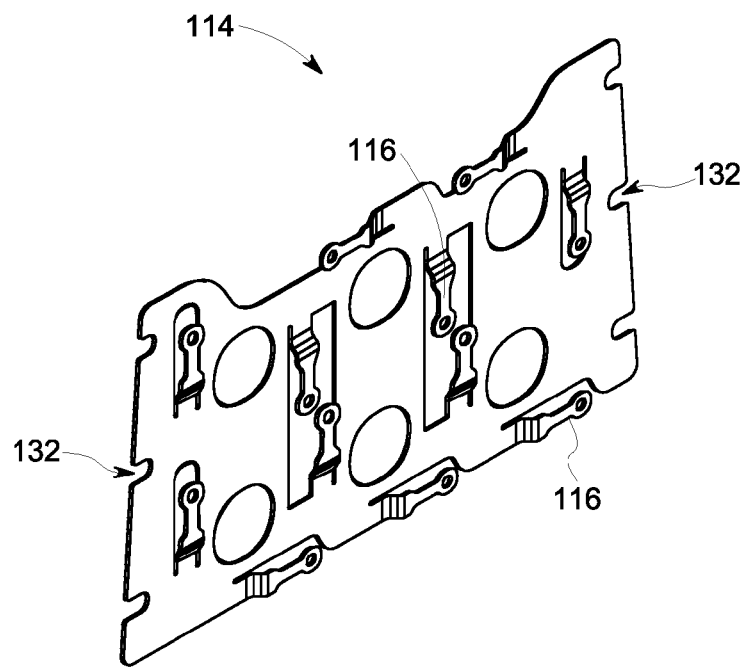
FIG. 15 is another perspective view of the spring plate of FIG. 8, before mounting a set of capacitors thereto.
Figure 16:
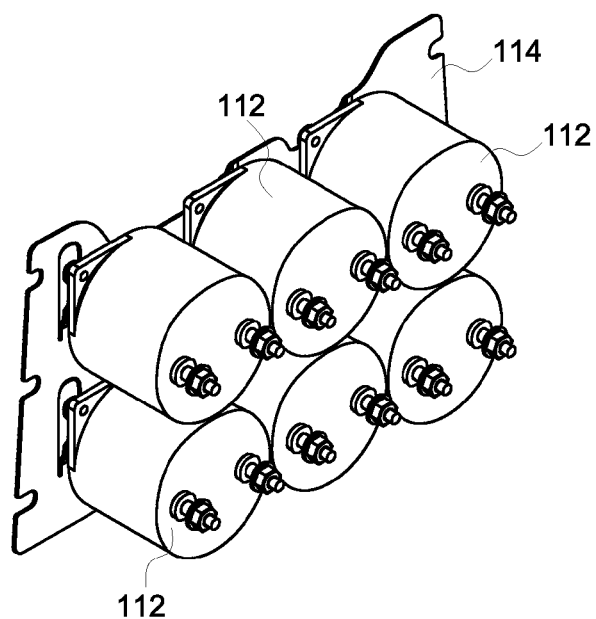
FIG. 16 is a perspective view of the spring plate of FIG. 8 with a set of capacitors mounted to spring tabs of the spring plate.

With specific reference to FIGS. 4, 15, and 16, to assemble embodiments of the apparatus 100, the tabs 116 of the spring plate 114 are first connected to the mechanical mounting feet of a set of capacitors 112, utilizing bolts, as best shown in FIG. 16. Each capacitor 112 is then secured to the laminated busbar 110, again using bolts, as best shown in FIG. 4. While FIGS. 4 and 16 illustrate the utilization of bolts to mount the capacitors 112 to the tabs 116 spring plate 114 and to the busbar 110, other fastening means or mechanisms known in the art may also be utilized without departing from the broader aspects of the invention.

Figure 17:
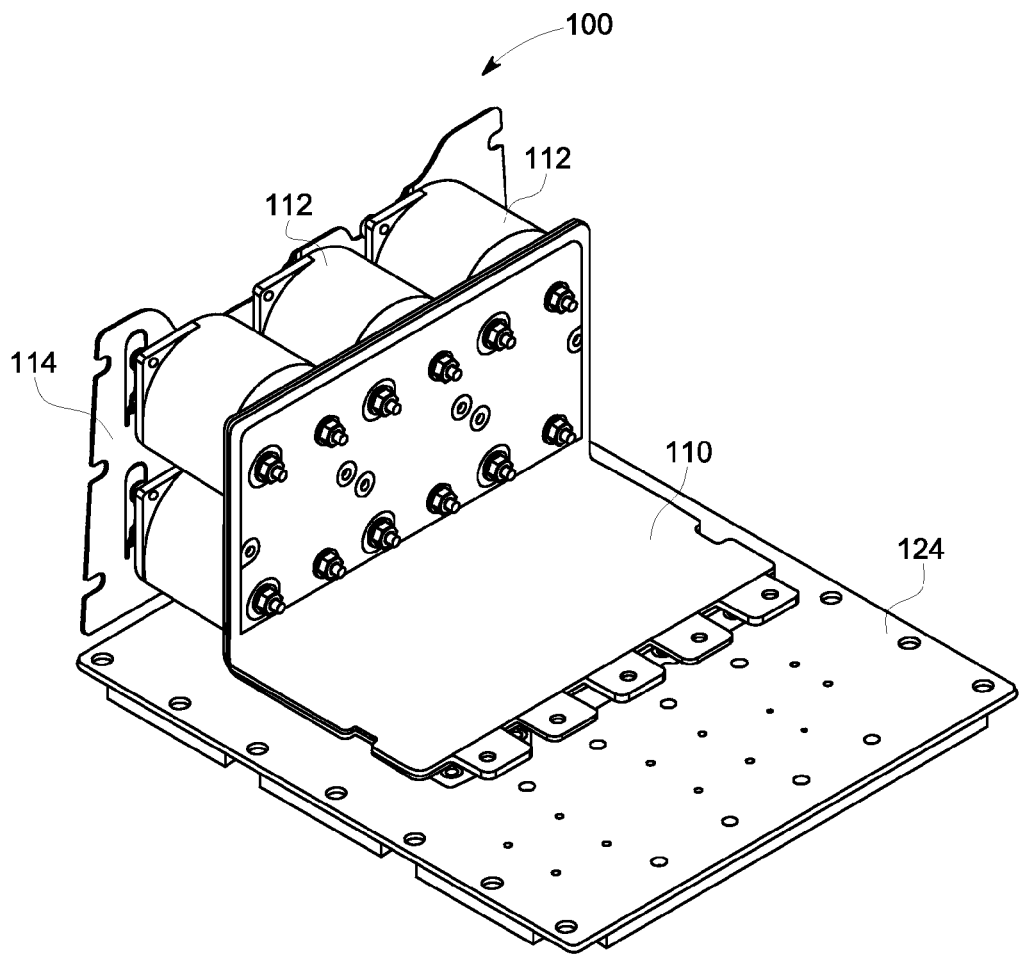
FIG. 17 is a perspective view of the apparatus of FIG. 4, shown mounted to a flat plate substrate.
Figure 18:
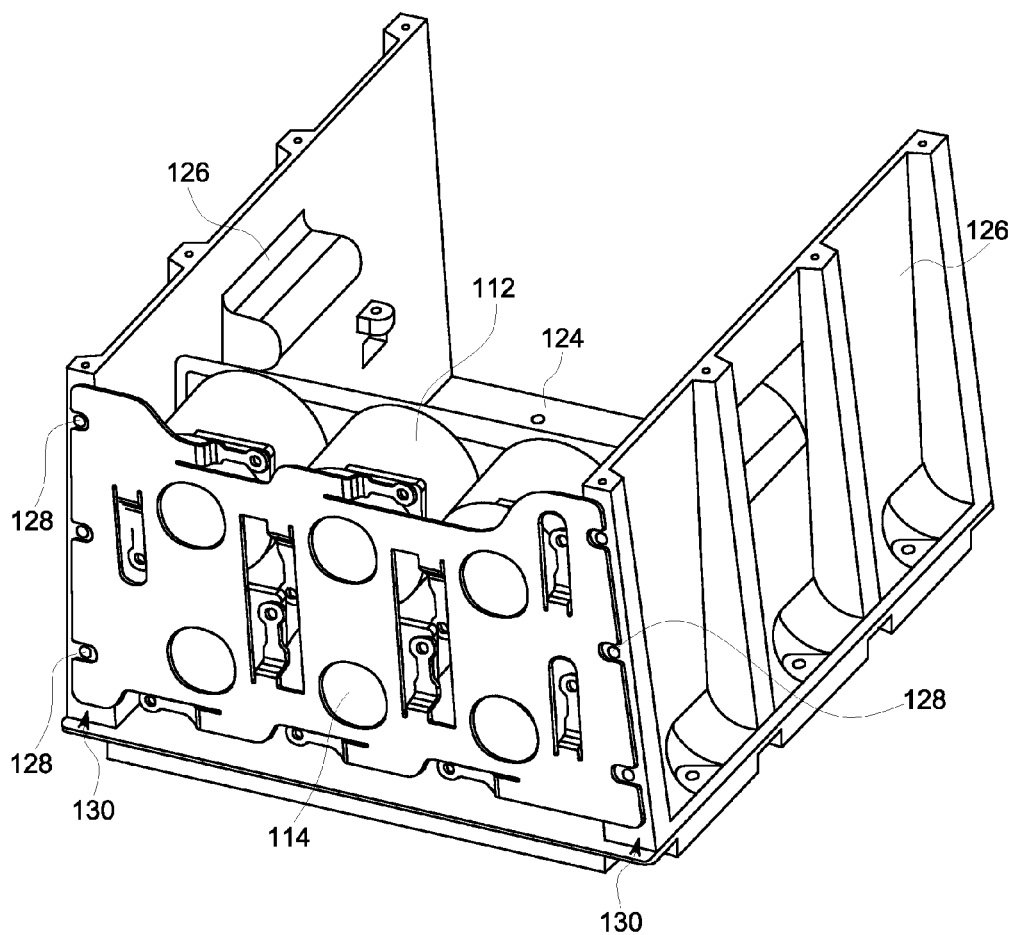
FIG. 18 is a perspective view of the apparatus of FIG. 4 mounted on a flat plate substrate having sidewalls, at an intermediate step.
Figure 19:
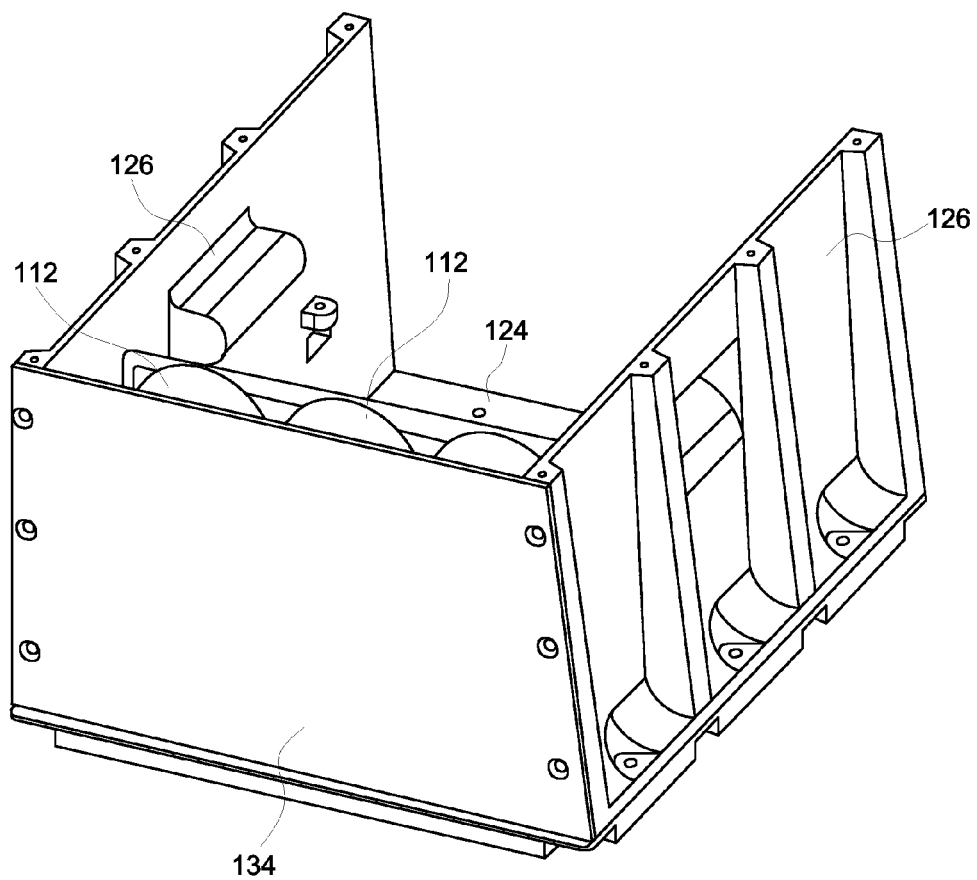
FIG. 19 is a perspective of the apparatus of FIG. 4, shown mounted within an enclosure.

Referring now to FIGS. 17-19, in an embodiment, the apparatus 100 may be secured within an enclosure, as discussed in detail hereinafter. In particular, as best shown in FIG. 17, the apparatus 100 may be secured to a flat plate substrate 124 having a plurality of insulated-gate bipolar transistors ("IGBTs") or other transistors or other solid state electronic devices (not shown) by attaching the laminated busbar 110 to the IGBTs in a manner heretofore known in the art. As shown in FIG. 18, sidewalls 126 may then be mounted to the flat plate substrate 124. The sidewalls 126 include screw holes 128 on the back vertical faces 130 thereof. The spring plate 114 aligns with the back, vertical face 130 of each sidewall and includes slots 132 therein that are aligned with the screw holes 128. With reference to FIG. 19, a back wall 134 is then screwed to each sidewall 126, clamping the spring plate 114 in place. In an embodiment, the enclosure made up of the flat plate 124, sidewalls 126, and back wall 134 is the housing of an inverter. As will be readily appreciated, by housing the apparatus 100 within an enclosure, e.g., the housing of an inverter, the external decorative aesthetics are not disrupted.

Referring once again to FIG. 4, the apparatus 100 of the present invention introduces compliance at the mechanical joint between the capacitors 112 and the support structure, i.e., the spring plate 114. The spring plate design creates this compliance to alleviate assembly stresses due to unavoidable variation in capacitor geometry, while providing support for the mass of the capacitors 112, to reduce the resultant mechanical load at the electrical terminals 113 due to the mass of the capacitors 112.

Figure 20:
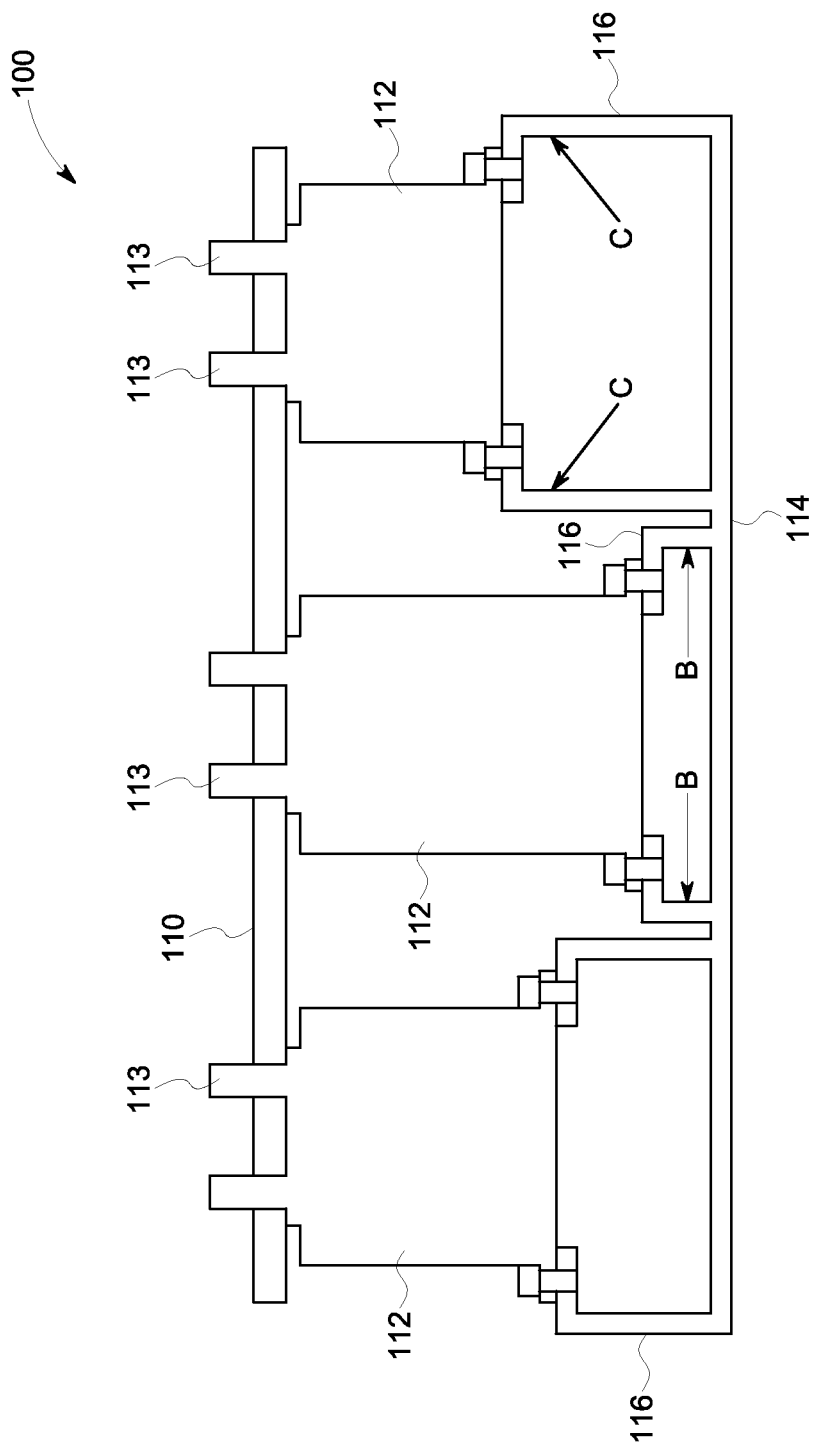
FIG. 20 is a cross-sectional view of the apparatus of FIG. 4, illustrating how the spring tabs of the spring plate function to compensate for variations in capacitor height.

FIG. 20 is a side, cross-sectional view of an embodiment of the apparatus 100, illustrating how the spring plate 114 and tabs 116 thereof provide support for the capacitors 112 while simultaneously reducing the mechanical load on the electrical terminals 113 of the capacitors due to variation in capacitor geometry. As shown therein, capacitors that are less than or greater than the nominal dimension deflect the tabs 116 of the spring plate 114 either in or out. For example, the left-most capacitor 112 in FIG. 20 has a nominal dimension and mates comfortably with the left-most spring tab 116 such that the spring tab 116 is not under substantial tensile or compressive force. The middle capacitor 112 has a height that is greater than the nominal height. As shown therein, because of this greater height, the capacitor 112 deflects the spring tabs 116 to which it is mounted downward, thereby introducing a compressive force in the spring tabs 116 and spring plate 114, as indicated by arrows B. Conversely, the right-most capacitor 112 in FIG. 20 has a height that is less than the nominal height. As a result, the capacitor 112 deflects the spring tabs 116 to which it is mounted upward, introducing a compressive fore in the spring tabs 116, as indicated by arrows C. (As should be appreciated, in this context, the height of a capacitor is its dimension as between the busbar and spring plate, which may be a long axis of the capacitor.)

As will be readily appreciated, the resulting tensile or compressive force on the capacitors 112 and busbar 110 is effectively less than the force would be had the capacitor mounting feet been attached in a typical mounting configuration to a rigid surface like, for example, back wall 134. The apparatus 100 of the present invention, by way of the spring plate 114, also supports the mass of the capacitors to reduce the load on the electrical terminals 113 at their electrical connection with the busbar 110. In addition, it facilitates packaging and assembly efficiency, and inductance improvement over cabling associated with employment of a 1-piece laminated busbar.

As described above, the tabs 116 of the spring plate 114 have a unique and specific geometry that results in a stiffness that, under an expected deflection, produces a desirable amount of spring force on the capacitors 112 and laminated busbar 110. The spring plate 114 and tabs 116 support the mass of the capacitors, thereby producing minimal mechanical load on the electrical joint between the capacitor 112 (i.e., the electrical terminals thereof 113) and the busbar 110.

As will be readily appreciated, the apparatus 100 of the present invention therefore provides a number of distinct technical advantages. As discussed, the apparatus 100 reduces the mechanical load on the electrical joint through support of the mass of the capacitors 112. In addition, the provision of the deflectable spring tabs 116 reduces the stress in the capacitor electrical terminals 113 and busbar 110 by accommodating variances in capacitor geometry. The spring plate 114 requires no dedicated mounting and can be integrated into existing features and devices (e.g., inverters).

In addition to the above, the apparatus 100 of the present invention also utilizes available packaging space, e.g., in the housing of inverters, efficiently. Inductance of the system, as a whole, is also lowered by facilitating the use of a laminated busbar. As will be readily appreciated, the apparatus 100 of the present invention is effective in high temperature environments by achieving compliance without requiring the use of any type of soft composite materials.

As a result of these technical advantages, a number of commercial advantages can also be realized. In particular, labor cost may be reduced through the elimination of cabling or individual copper and insulation layers, and by the spring plate mounting design being integrated into existing systems. In addition, the apparatus 100 of the present invention provides for a reduction in the number of required components, thereby decreasing cost and assembly time. Moreover, because the apparatus 100 of the present invention is able to compensate for variations in capacitor height and thereby reduce the mechanical stress on the electrical terminals of the capacitor and the busbar, reductions in cost are realized by preventing failures in the busbar and capacitors during assembly, and reliability and durability of the system, as a whole is improved, thereby increasing system life. Finally, capacitor cost is reduced by eliminating the requirement for extremely tight geometric tolerance in capacitor manufacture.

In embodiments, the support (e.g., plate) may be a wall of an enclosure. That is, in embodiments as described above, the plate 114 is a separate member/element that is intermediate the busbar/capacitors and a wall of the enclosure. However, the deflectable tabs could instead be attached to a body that is configured to also function as a wall of the enclosure, such that there is no separate, additional planar body between the capacitors and wall.

An embodiment of the present invention relates to an apparatus for reducing the mechanical load on the electrical terminals of a capacitor. The apparatus includes a support having one or more deflectable tabs, one or more capacitors respectively mounted to the support via the one or more deflectable tabs, and a busbar electrically connected to the one or more capacitors such that the one or more capacitors are arranged intermediate the support and the busbar.

In an embodiment, the support comprises a plate having a planar body and the one or more deflectable tabs connected to the planar body.

In an embodiment, the one or more capacitors include respective mounting feet and respective pairs of electrical terminals, the one or more capacitors are respectively mounted to the one or more deflectable tabs through the mounting feet, and the electrical terminals of the one or more capacitors form an electrical connection with the busbar.

In an embodiment, each deflectable tab of the one or more deflectable tabs is configured to bias towards and away from the planar body in response to an applied force for reducing a mechanical load on the electrical terminals of a respective one of the one or more capacitors that is mounted to the deflectable tab. The applied force may be one of a compressive force causing the deflectable tab to bias towards the planar body or a tensile force causing the deflectable tab to bias away from the planar body. (For example, the applied force may result from the one or more capacitors pulling or pressing on the one or more deflectable tabs, due to differences in heights of the one or more capacitors in relation to a set distance between the busbar and the planar body of the plate (or an underlying sidewall supporting the planar body); here, height refers to a dimension of the capacitor as between the busbar and planar body.)

In an embodiment, the one or more deflectable tabs extend longitudinally over respective one or more relieved portions of the plate, and each of the one or more deflectable tabs includes a respective angle portion and a respective distal end having a mounting aperture.

In an embodiment, each deflectable tab of the one or more deflectable tabs is configured to provide support for a mass of a respective one of the one or more capacitors that is mounted to the deflectable tab.

In an embodiment, each deflectable tab of the one or more deflectable tabs is configured to provide support for a mass of a respective one of the one or more capacitors that is mounted to the deflectable tab via a spring force.

In an embodiment, the one or more deflectable tabs are configured to deflect towards and away from the planar body of the plate in dependence upon respective heights of the one or more capacitors, to alleviate stresses in at least one of the one or more capacitors and the busbar.

In an embodiment, the busbar is substantially L-shaped in cross section.

In an embodiment, the plate is made of steel.

In an embodiment, the apparatus may include an enclosure housing the plate, the one or more capacitors, and the busbar. The enclosure may include a substrate and a plurality of upstanding walls attached to the substrate, wherein the busbar is mounted to the substrate within the enclosure. The one or more deflectable tabs are configured to deflect towards and away from the planar body of the plate. The plate is attached to at least one of the upstanding walls, wherein at least one of the at least one of the upstanding walls to which the plate is attached provides support for the plate for the one or more deflectable tabs to deflect towards or away from the planar body, in dependence upon respective heights of the one or more capacitors, to alleviate stresses in at least one of the one or more capacitors and the busbar. In an embodiment, the one or more deflectable tabs of the plate comprise plural deflectable tabs, and the one or more capacitors comprise plural capacitors mounted to the plate respectively via the plural deflectable tabs.

In an embodiment, the busbar is a laminated busbar.

In another embodiment, an apparatus include an enclosure comprising a substrate and a plurality of upstanding walls attached to the substrate, a plate within the enclosure, the plate comprising a planar body and plural deflectable tabs connected to the planar body, a laminated busbar mounted to the substrate within the enclosure, and plural capacitors within the enclosure, the plural capacitors comprising respective mounting feet and respective pairs of electrical terminals, wherein the mounting feet are respectively mechanically mounted to the deflectable tabs of the plate and the electrical terminals are electrically connected to the laminated busbar such that the capacitors are sandwiched between the plate and the busbar. The plate is attached to at least one of the upstanding walls that provide support for the plate for the deflectable tabs to deflect towards and away from the planar body, in dependence upon respective heights of the capacitors, to alleviate stresses in the capacitors and/or the busbar.

In yet another embodiment, a method for reducing the mechanical load on the electrical terminals of a capacitor is provided. The method includes the steps of providing a support having a plurality of deflectable tabs (e.g., the support may comprise a plate having a planar body and the plurality of deflectable tabs attached to the planar body), mounting a capacitor to the support by fastening a mounting foot of the capacitor to at least one of the deflectable tabs, and creating an electrical connection between the capacitor and a busbar by fastening electrical terminals of the capacitor to the busbar. In another embodiment, the support may already be provided, and the method comprises mounting and creating an electrical connection as indicated.

In an embodiment where the support comprises a plate (e.g., having the planar body and the plurality of deflectable tabs attached to the planar body), the method further includes the steps of securing the busbar to a substrate, mounting sidewalls to the substrate, and mounting a back wall to one of the substrate and the sidewalls such that the plate is sandwiched between the back wall and the sidewalls. In an embodiment, the substrate, sidewalls, and back wall provide an enclosure for the capacitor.

In an embodiment where the support comprises a plate (e.g., having the planar body and the plurality of deflectable tabs attached to the planar body), the deflectable tabs are configured to bias towards and away from the planar body in response to an applied force.

In an embodiment where the support comprises a plate (e.g., having the planar body and the plurality of deflectable tabs attached to the planar body), the deflectable tabs extend longitudinally over relieved portions of the planar body and include an angled portion and a distal end having a mounting aperture for connecting the tabs to the mounting foot of the capacitor.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. While the dimensions and types of materials described herein are intended to define the parameters of the invention, they are by no means limiting and are exemplary embodiments. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," "third," "upper," "lower," "bottom," "top," etc. are used merely as labels, and are not intended to impose numerical or positional requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose several embodiments of the invention, including the best mode, and also to enable one of ordinary skill in the art to practice the embodiments of invention, including making and using any devices or systems and performing any incorporated methods. The patentable scope of the invention is defined by the claims, and may include other examples that occur to one of ordinary skill in the art. Such other examples are intended to be within the scope of the claims if they have structural elements that do not differ from the literal language of the claims, or if they include equivalent structural elements with insubstantial differences from the literal languages of the claims.

As used herein, an element or step recited in the singular and proceeded with the word "a" or "an" should be understood as not excluding plural of the elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property.

Since certain changes may be made in the embodiments described herein without departing from the spirit and scope of the invention herein involved, it is intended that all of the subject matter of the above description or shown in the accompanying drawings shall be interpreted merely as examples illustrating the inventive concept herein and shall not be construed as limiting the invention.

What is claimed is:

1. an apparatus, comprising: a support having one or more deflectable tabs; one or more capacitors respectively mounted to the support via the one or more deflectable tabs; and a busbar electrically connected to the one or more capacitors such that the one or more capacitors are arranged intermediate the support and the busbar, wherein the support comprises a plate having a planar body and the one or more deflectable tabs connected to the planar body, the one or more deflectable tabs extend longitudinally over respective one or more relieved portions of the plate, and each of the one or more deflectable tabs includes a respective angle portion and a respective distal end having a mounting aperture.

2. The apparatus of claim 1, wherein:
the one or more capacitors include respective mounting feet and the respective pairs of electrical terminals;
the one or more capacitors are respectively mounted to the more or more deflectable tabs through the mounting feet; and
the electrical terminals of the one or more capacitors form an electrical connection with the busbar.

3. The apparatus of claim 2, wherein each deflectable tab of the one or more deflectable tabs is configured to bias towards and away from the planar body in response to an applied force for reducing a mechanical load on the electrical terminals of a respective one of the one or more capacitors that is mounted to the deflectable tab.

4. The apparatus of claim 3, wherein the applied force is one of a compressive force causing the deflectable tab to bias towards the planar body or a tensile force causing the deflectable tab to bias away from the planar body.

5. The apparatus of claim 1, wherein each deflectable tab of the one or more deflectable tabs is configured to provide support for a mass of a respective one of the one or more capacitors that is mounted to the deflectable tab.

6. The apparatus of claim 1, wherein each deflectable tab of the one or more deflectable tabs is configured to provide support for a mass of a respective one of the one or more capacitors that is mounted to the deflectable tab via a spring force.

7. The apparatus of claim 1, wherein:
the one or more deflectable tabs are configured to deflect towards and away from the planar body of the plate in dependence upon respective heights of the one or more capacitors, to alleviate stresses in at least one of the one or more capacitors or the busbar.

8. The apparatus of claim 1, wherein the busbar is substantially L-shaped in cross section.

9. The apparatus of claim 1, wherein the plate is made of steel.

10. The apparatus of claim 1, further comprising:
an enclosure housing the plate, the one or more capacitors, and the busbar.

11. The apparatus of claim 10, wherein:
the enclosure comprises a substrate and a plurality of upstanding walls attached to the substrate; and
the busbar is mounted to the substrate within the enclosure.

12. The apparatus of claim 11, wherein:
the one or more deflectable tabs are configured to deflect towards and away from the planar body of the plate; and
the plate is attached to at least one of the upstanding walls, wherein at least one of the at least one of the upstanding walls to which the plate is attached provides support for the plate for the one or more deflectable tabs to deflect towards or away from the planar body, in dependence upon respective heights of the one or more capacitors, to alleviate stresses in at least one of the one or more capacitors or the busbar.

13. The apparatus of claim 1, wherein:
the one or more deflectable tabs of the plate comprise plural deflectable tabs; and
the one or more capacitors comprise plural capacitors mounted to the plate respectively via the plural deflectable tabs.

14. The apparatus of claim 1, wherein the busbar is a laminated busbar.

15. An apparatus, comprising:
an enclosure comprising a substrate and a plurality of upstanding walls attached to the substrate;
a plate within the enclosure, the plate comprising a planar body and plural deflectable tabs connected to the planar body;
a laminated busbar mounted to the substrate within the enclosure; and
plural capacitors within the enclosure, the plural capacitors comprising respective mounting feet and respective pairs of electrical terminals, wherein the mounting feet are respectively mechanically mounted to the deflectable tabs of the plate and the electrical terminals are electrically connected to the laminated busbar such that the capacitors are sandwiched between the plate and the busbar;

wherein the plate is attached to at least one of the upstanding walls that provides support for the plate for the deflectable tabs to deflect towards and away from the planar body, in dependence upon respective heights of the capacitors, to alleviate stresses in at least one of the capacitors or the busbar.

* * * * *